(12) United States Patent
Sano

(10) Patent No.: US 10,969,815 B2
(45) Date of Patent: Apr. 6, 2021

(54) CONSTANT CURRENT CIRCUIT

(71) Applicant: ABLIC Inc., Chiba (JP)

(72) Inventor: Minoru Sano, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/572,225

(22) Filed: Sep. 16, 2019

(65) Prior Publication Data

US 2020/0097035 A1 Mar. 26, 2020

(30) Foreign Application Priority Data

Sep. 21, 2018 (JP) ............................. JP2018-177359

(51) Int. Cl.
  *G05F 3/24* (2006.01)
  *G05F 1/46* (2006.01)
  *H03F 3/345* (2006.01)
  *G05F 3/26* (2006.01)

(52) U.S. Cl.
  CPC ............... *G05F 3/242* (2013.01); *G05F 1/46* (2013.01); *G05F 3/26* (2013.01); *H03F 3/345* (2013.01)

(58) Field of Classification Search
  CPC . G05F 3/26; G05F 3/242; G05F 3/262; G05F 3/265; G05F 1/46; H05F 3/345
  USPC .......................... 323/274, 275, 315, 316, 901
  See application file for complete search history.

(56) References Cited

U.S. PATENT DOCUMENTS

| | | | | | |
|---|---|---|---|---|---|
| 5,696,440 | A | * | 12/1997 | Harada | G05F 3/262 323/315 |
| 7,550,958 | B2 | * | 6/2009 | Lee | G05F 3/30 323/315 |
| 7,554,313 | B1 | * | 6/2009 | Leitner | G05F 3/262 323/315 |
| 8,339,117 | B2 | * | 12/2012 | Sicard | G05F 3/30 323/315 |
| 8,400,124 | B2 | * | 3/2013 | Stellberger | G05F 1/575 323/274 |
| 10,326,362 | B2 | * | 6/2019 | Takada | H02M 3/156 |
| 10,498,313 | B1 | * | 12/2019 | Takada | H03K 3/356069 |
| 10,559,968 | B2 | * | 2/2020 | Saito | H02J 7/0047 |
| 2010/0164462 | A1 | * | 7/2010 | Yen | H02M 3/156 323/288 |
| 2011/0127989 | A1 | * | 6/2011 | Hikichi | G05F 3/242 323/315 |

FOREIGN PATENT DOCUMENTS

JP 2011-118532 A 6/2011

* cited by examiner

*Primary Examiner* — Yemane Mehari
(74) *Attorney, Agent, or Firm* — Brinks Gilson & Lione

(57) ABSTRACT

The constant current circuit includes a constant current generation circuit, a start-up detection circuit configured to detect start-up of the constant current generation circuit, and a clamp circuit configured to output a start-up voltage to the constant current generation circuit. The start-up voltage output from the clamp circuit is a voltage close to gate voltages that are higher than gate voltages of transistors that form a current mirror circuit of the constant current generation circuit, in a state where the constant current generation circuit is operating.

1 Claim, 5 Drawing Sheets

CONSTANT CURRENT CIRCUIT

RELATED APPLICATIONS

This application claims priority to Japanese Patent Application No. 2018-177359, filed on Sep. 21, 2018, the content of which is incorporated herein by reference.

BACKGROUND OF THE INVENTION

1. Field of the Invention

The present invention relates to a constant current circuit.

2. Description of the Related Art

As one technology of saving power consumption of an electronic circuit, there has been known an intermittent operation technology, which puts an unused circuit to sleep so as to save power consumption. During such intermittent operations, a constant current circuit is required to start up stably in a short time.

FIG. 5 is a circuit diagram for illustrating a conventional constant current circuit which includes a start-up circuit. The conventional constant current circuit 500 is an example for the conventional constant current circuit. The conventional constant current circuit 500 includes a constant current circuit unit 510 and a start-up circuit unit 520.

In the conventional constant current circuit 500, since the constant current circuit unit 510 does not start up if a voltage at a node "A" is low, the start-up circuit unit 520 is provided therefor. If the voltage at the node "A" is low, the start-up circuit unit 520 turns on an NMOS transistor 521 to draw a start-up current from a PMOS transistor 511, so as to start up the constant current circuit unit 510 (see, e.g., Japanese Patent Application Laid-open No. 2011-118532).

SUMMARY OF THE INVENTION

A gate-source voltage of the PMOS transistor 511 varies depending on a power supply voltage. Thus, in the conventional constant current circuit 500, if high power supply voltage is applied, an excessive start-up current flows from the PMOS transistor 511 to the NMOS transistor 521.

An object of at least one embodiment of the present invention is to provide a constant current circuit in which an excessive current does not flow upon start-up even if high power supply voltage is applied.

According to at least one embodiment of the present invention, there is provided a constant current circuit including a constant current generation circuit including a resistor connected to a ground terminal, a first current mirror circuit connected to the ground terminal and the resistor, the first current mirror circuit containing a plurality of transistors and a second current mirror circuit connected between a power supply terminal supplying a power supply voltage and the first current mirror circuit; and a start-up detection circuit configured to detect start-up of the constant current generation circuit, and transmit a detection signal; a clamp circuit configured to apply a start-up voltage to the constant current generation circuit, the start-up voltage being a voltage close to the gate voltages of the plurality of transistors in the first current mirror circuit in a state where the constant current generation circuit operates, the start-up voltage being higher than the gate voltages of the plurality of transistors; and a power supply start-up detection circuit configured to detect whether the power supply voltage is applied to the power supply terminal, start up the clamp circuit by detecting the power supply voltage applied to the power supply terminal, receive the detection signal from the start-up detection circuit, and stop the clamp circuit by receiving the detection signal.

According to the constant current circuit of at least one embodiment of the present invention, since a constant current generation circuit starts up using a clamp voltage generated by a clamp circuit, an excessive current does not flow upon start-up even if high power supply voltage is applied.

DETAILED DESCRIPTION OF THE PREFERRED EMBODIMENTS

Figure 1:
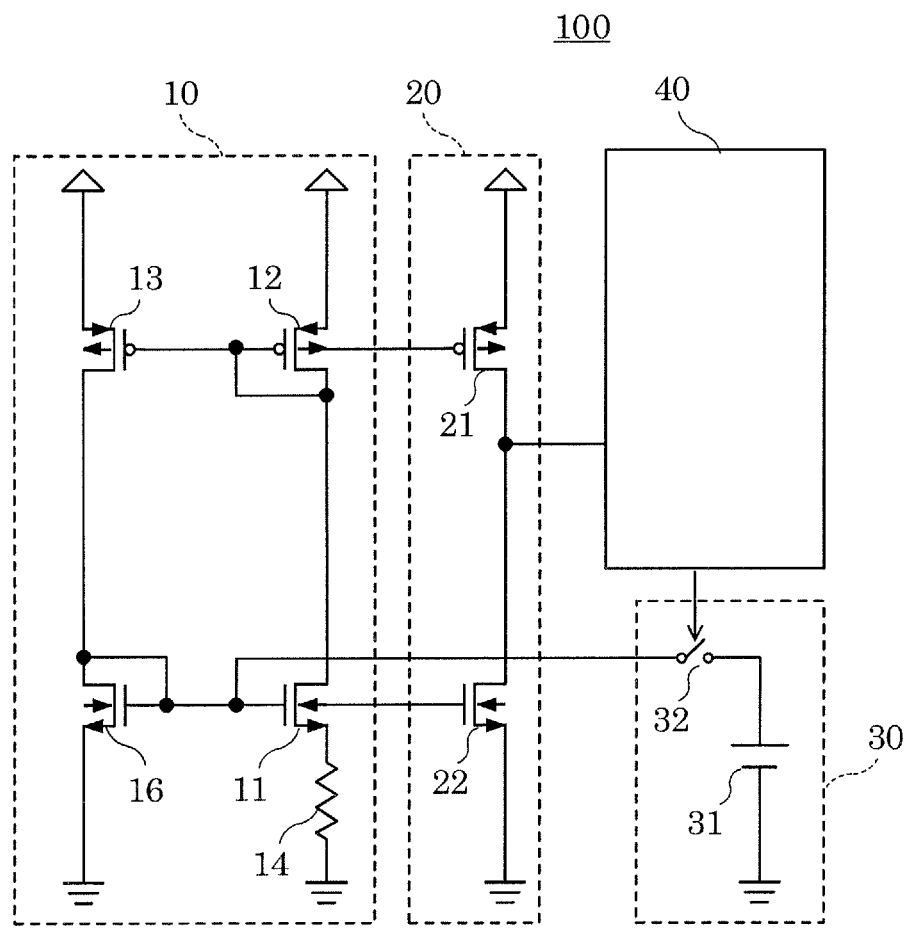
FIG. 1 is a block diagram for illustrating a configuration example of a constant current circuit according to at least one embodiment of the present invention.

FIG. 1 is a block diagram for illustrating a configuration example of a constant current circuit 100 according to at least one embodiment of the present invention. The constant current circuit 100 includes a constant current generation circuit 10, a start-up detection circuit 20, a clamp circuit 30, and a power supply start-up detection circuit 40.

The constant current generation circuit 10 includes NMOS transistors 11 and 16, PMOS transistors 12 and 13, and a resistor 14. The NMOS transistors 11 and 16 constitute the first current mirror circuit. The PMOS transistors 12 and 13 constitute the second current mirror circuit. The start-up detection circuit 20 includes a PMOS transistor 21 and an NMOS transistor 22, to thereby constitute a constant current inverter. The start-up detection circuit 20 includes an output terminal O20 (illustrated in FIG. 2) between the PMOS transistor 21 and the NMOS transistor 22. The clamp circuit 30 includes a voltage source 31, a switch device 32 and an output terminal O30 (illustrated in FIG. 2).

In the constant current generation circuit 10, each of the NMOS transistors 11 and 16 contains a gate connected to an output terminal O30 of the clamp circuit 30. In the start-up detection circuit 20, the PMOS transistor 21 contains a gate connected to a gate of the PMOS transistor 13. The NMOS transistor 22 contains a gate connected to the gate of the NMOS transistor 11. The power supply start-up detection circuit 40 includes an input terminal (not illustrated) and an output terminal O40 (illustrated in FIG. 2). The input terminal is connected to the output terminal O20. In the clamp circuit 30, the voltage source 31 is connected to the output terminal O30 via the switch device 32, and a control terminal of the switch device 32 is connected to the output terminal O40.

If the constant current generation circuit 10 does not start up right after power-on, both the PMOS transistor 21 and the NMOS transistor 22 of the start-up detection circuit 20 are turned off. Under the condition that both the PMOS transistor 21 and the NMOS transistor 22 of the start-up detection circuit 20 are turned off, a voltage at the output terminal O20 is in a high impedance state. In this high impedance state, if a power supply voltage is applied to the power supply start-up detection circuit 40, the power supply start-up detection circuit 40 determines that the constant current generation circuit 10 does not start up, and then transmits a start-up signal from the output terminal O40. In response to the start-up signal from the output terminal O40, the clamp circuit 30 turns on the switch device 32, to thereby supply a voltage of the voltage source 31. Here, the voltage of the voltage source 31 is set to a voltage which is higher than gate voltages (hereinafter, referred to as "normal gate voltages") of the NMOS transistors 11 and 16 during normal operations of the constant current generation circuit 10 and is lower than a minimum voltage generating excessive start-up current. That is, while the voltage of the voltage source 31 is higher than the normal gate voltages, the voltage of the voltage source 31 is preferably as low as possible. In this example, the voltage of the voltage source 31 is set to a voltage close to gate voltages that are higher than the normal gate voltages of the NMOS transistors 11 and 16.

The constant current generation circuit 10 starts up in such a manner that the voltage of the voltage source 31 in the clamp circuit 30 is applied to the gates of the NMOS transistors 11 and 16, to thereby generate a start-up current. The start-up detection circuit 20 detects the start-up of the constant current generation circuit 10, and then, turns on the NMOS transistor 22 to output a Low detection signal, for example. The power supply start-up detection circuit 40 receives the detection signal from the start-up detection circuit 20, and thereby stops transmitting the start-up signal so as to stop the operation of the clamp circuit 30.

As described above, in the constant current circuit 100, the clamp circuit 30 applies the above-mentioned voltage to the gates of the NMOS transistors 11 and 16 to start up the constant current generation circuit 10. Hence, the constant current circuit 100 can quickly start up without causing an excessive start-up current to flow therethrough.

Further, the start-up detection circuit 20 includes the constant current inverter having no power supply voltage dependency. This configuration additionally produces an effect that the start-up of the constant current generation circuit 10 can be detected independently of the power supply voltage.

Figure 2:
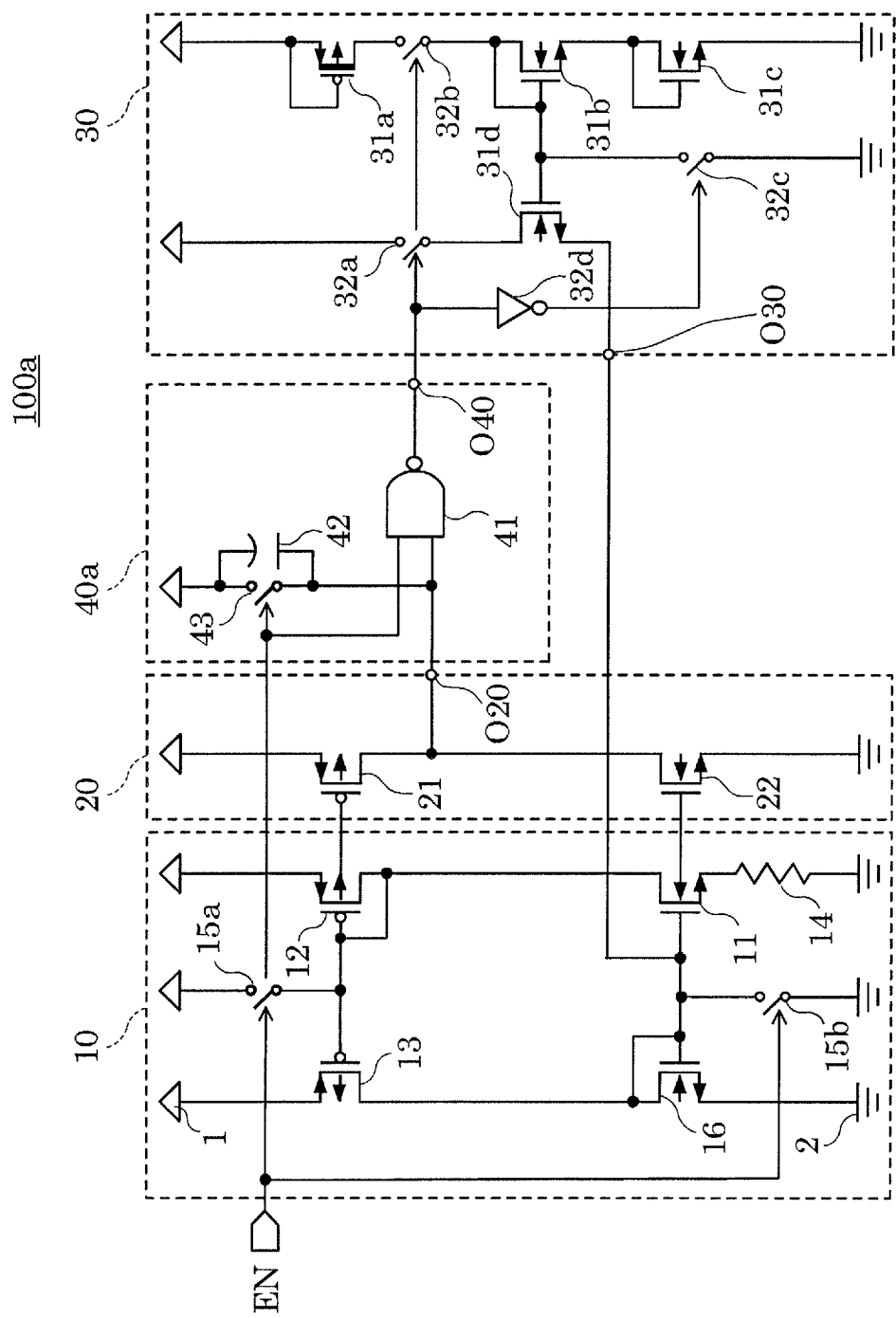
FIG. 2 is a circuit diagram for illustrating a first example of the constant current circuit of the embodiment.

FIG. 2 is a circuit diagram for illustrating an example of the constant current circuit of this embodiment. A constant current circuit 100a of FIG. 2 is an example circuit including an enable terminal EN that allows intermittent operations through use of an externally input enable signal VEN.

The constant current generation circuit 10 may further include switches 15a and 15b. The switch 15b is provided between a ground terminal 2 and the gates of the NMOS transistors 16 and 11. The switch 15a is provided between a power supply terminal 1 and the gates of the PMOS transistors 12 and 13. Control terminals of the switch 15a and the switch 15b are connected to the enable terminal EN.

The clamp circuit 30 in the constant current circuit 100a, e.g., includes a diode-connected depletion type PMOS transistor 31a, a diode-connected NMOS transistor 31b, a diode-connected NMOS transistor 31c, an NMOS transistor 31d, switches 32a, 32b, and 32c, and a NOT circuit 32d. The transistors 31a to 31d constitute the voltage source 31. The switches 32a, 32b, and 32c constitute the switch device 32. Control terminals of the switches 32a and 32b are connected to the output terminal O40. A control terminal of the switch 32c is connected to the output terminal O40 via the NOT circuit 32d.

The power supply start-up detection circuit 40a includes a NAND circuit 41 serving as a logic circuit, a capacitor 42, and a switch 43. The NAND circuit 41 contains a first input terminal connected to the enable terminal EN and a second input terminal connected to the output terminal O20. Further, the NAND circuit 41 contains an output terminal connected to the output terminal O40. The capacitor 42 and the switch 43 are connected in parallel between the power supply terminal and the second input terminal of the NAND circuit 41.

Here, the switches 15a, 15b, 32a, 32b, 32c, and 43 are configured to turn on if a Low control signal is received, and to turn off if a High control signal is received.

Figure 3:
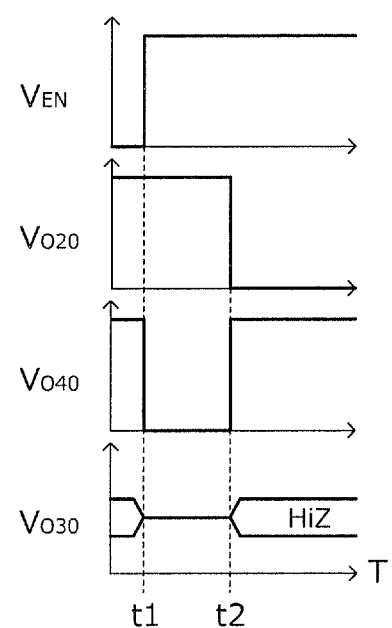
FIG. 3 is a timing chart for illustrating operation of the first example of the constant current circuit.

Next, operations of the constant current circuit 100a are described. FIG. 3 is a timing chart for illustrating an operation of the constant current circuit 100a.

Since the enable signal VEN is at a Low level before time t1, the switches 15a and 15b are turned on. As a result of turning on the switches 15a and 15b, the constant current generation circuit 10 stops operating. Further, the PMOS transistor 21 and the NMOS transistor 22 are turned off, while the switch 43 is turned on, so that a voltage VO20 (which will be referred to as "output voltage VO20") at the output terminal O20 of the start-up detection circuit 20 is at a High level. In the power supply start-up detection circuit 40a, the High level output voltage VO20 and the Low level enable signal VEN are input to the NAND circuit 41, so that the voltage VO40 (which will be referred to as "output voltage VO40") at the output terminal O40 of the power supply start-up detection circuit 40a is at a High level.

Since the High level output voltage VO40 is applied to the clamp circuit 30, to thereby turn off the switches 32a and 32b and turn on the switch 32c, the clamp circuit 30 stops operating, and therefore the voltage VO30 (which will be referred to as "output voltage VO30") at the output terminal O30 is in a high impedance state.

When the enable signal VEN is switched to a High level at time point t1, the switches 15a and 15b are turned off, but the PMOS transistor 21 and the NMOS transistor 22 are turned off unless the constant current generation circuit 10 starts up. The voltage at the second input terminal of the NAND circuit 41 is kept at a High level by the capacitor 42 even if the switch 43 is turned off. The NAND circuit 41 receives the High level output voltage VO20 and the High enable signal VEN, so that the output voltage VO40 is at a Low level.

With this operation, the switches 32a and 32b are turned on, and the switch 32c is turned off, so that the clamp circuit 30 starts operating. The clamp circuit 30 outputs a voltage required to start up the constant current generation circuit 10 from a source of the NMOS transistor 31d. This voltage is determined based on a voltage generated at the gate of the NMOS transistor 31b by a current flowing from the depletion type PMOS transistor 31a into the NMOS transistor 31b and the NMOS transistor 31c.

The output voltage VO30 is expressed by the following expression:

$$VO30 = VGS31b + VGS31c - VGS31d,$$

wherein VGS31b, VGS31c, and VGS31d represent gate-source voltages of the NMOS transistor 31b, the NMOS transistor 31c, and the NMOS transistor 31d, respectively.

In this example, the output voltage VO30 is set to a voltage close to the normal gate voltages of the NMOS transistors 11 and 16 by adjusting the voltages VGS31b, VGS31c, and VGS31d. With this configuration, the constant current circuit 100a allows the constant current generation circuit 10 to generate the start-up current of which current value is close to that of a current flowing during normal operations, and can quickly start up without causing an excessive start-up current to flow therethrough. The output voltage VO30 is set to satisfy the following expression:

$$V1 < VO30 < V2,$$

wherein V1 represents the normal gate voltages of the NMOS transistors 11 and 16, and V2 represents the minimum voltage generating excessive start-up current. The voltage closed to the normal gate voltages of the NMOS transistors 11 and 16 is selected from voltages which are closer to V1 than V2.

The constant current generation circuit 10 starts up at time point t2. After the constant current generation circuit 10 starts up, the start-up detection circuit 20 detects the start-up due to an increase in gate voltages of the NMOS transistors 11 and 16. In response to the detection, the output voltage VO20 is switched to a Low level by the constant current inverter constructed by the PMOS transistor 21 and the NMOS transistor 22. The NAND circuit 41 receives the Low level output voltage VO20, and thus transmits a High level voltage, to thereby cause the clamp circuit 30 to stop operating. Through the above-mentioned operations, the start-up operation of the constant current circuit 100a is completed.

As described above, in the constant current circuit 100a, the clamp circuit 30 applies the above-mentioned voltage to the gates of the NMOS transistors 16 and 11, to thereby start up the constant current generation circuit 10, so that the constant current circuit 100a can quickly start up without causing an excessive start-up current to flow therethrough.

Figure 4:
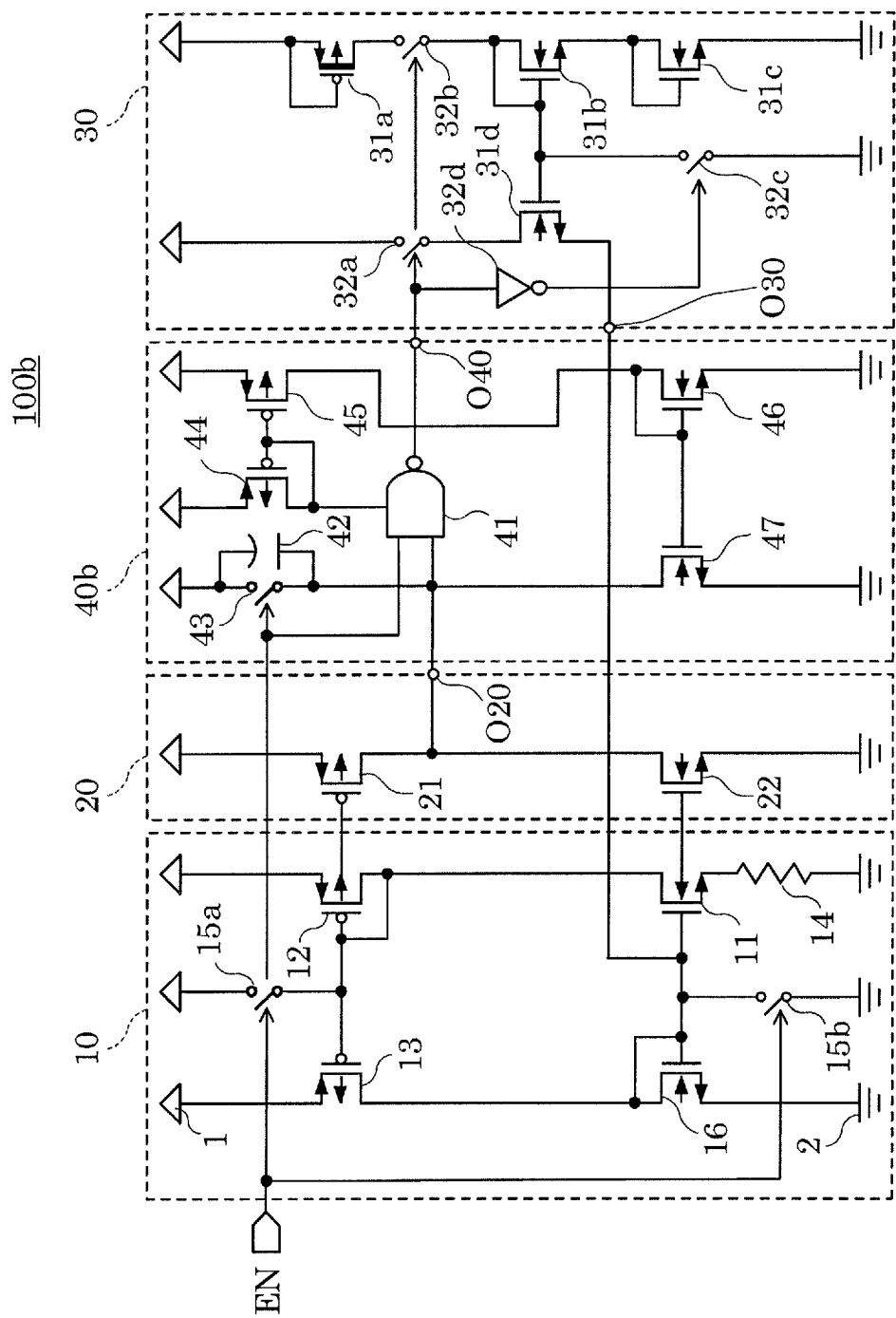
FIG. 4 is a circuit diagram for illustrating a second example of the constant current circuit of the embodiment.
Figure 5:
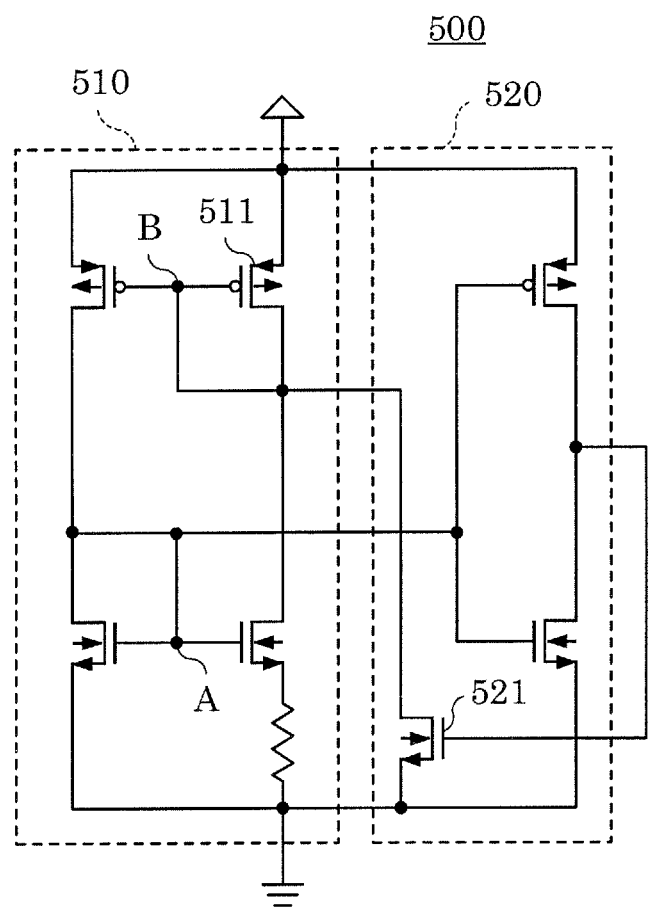
FIG. 5 is a circuit diagram for illustrating a conventional constant current circuit.

FIG. 4 is a circuit diagram for illustrating a second example of the constant current circuit 100. A power supply start-up detection circuit 40b of a constant current circuit 100h includes PMOS transistors 44 and 45 constituting a third current mirror circuit and NMOS transistors 46 and 47 constituting a fourth current mirror circuit, in addition to the components of the power supply start-up detection circuit 40a. The other circuit configuration of the constant current circuit 100b is the same components as those of the constant current circuit 100a and therefore, the same components are denoted by identical reference symbols and descriptions thereof are omitted.

When the output voltage VO20 is switched to a Low level in the start-up detection circuit 20, the capacitor 42 is discharged by the constant current inverter. Thus, it takes some time to invert the voltage level thereof from High to Low. In other words, it takes some time to invert the voltage applied to the input terminal of the NAND circuit 41. Thus, a through-current is generated in the NAND circuit 41. In order to deal with such a situation, the third current mirror circuit and the fourth current mirror circuit are provided in the power supply start-up detection circuit 40b so as to use an operating current of the NAND circuit 41 for a discharge current of the capacitor 42.

When a through-current is generated in the NAND circuit 41 at the time of discharging the capacitor 42, the third current mirror circuit and the fourth current mirror circuit discharge the capacitor 42 with use of the through-current generated in the NAND circuit 41. In the constant current circuit 100b, if the start-up detection circuit 20 detects the start-up of the constant current generation circuit 10, the output voltage VO20 can be quickly inverted to a Low level.

The embodiment of the present invention has been described above, but the present invention is not limited to the above-mentioned embodiment, and it is understood that various modifications can be made thereto without departing from the gist of the present invention.

As for the present invention, for example, since the voltage source 31 is merely configured to transmit a voltage close to gate voltages that are higher than the gate voltages of the NMOS transistors 11 and 16, the voltage source 31 is not limited to the illustrated circuit. Further, the start-up detection circuit 20 is merely configured to be a circuit capable of detection start-up of the constant current generation circuit 10, and is not therefore limited to the illustrated constant current inverter. Furthermore, in the constant current circuit such as the constant current circuit 100a illustrated in FIG. 2, the enable terminal EN is provided, but the constant current circuit according to the present invention is not limited thereto. The power supply start-up detection circuit 40 may be configured to detect start-up of the power supply irrespective of the enable signal to start up the clamp circuit 30. In addition, any logic circuit other than the above-mentioned circuit may be adopted.

What is claimed is:

1. A constant current circuit comprising:
    a constant current generation circuit including:
        a resistor connected to a ground terminal;
        a first current mirror circuit connected to the ground terminal and the resistor, the first current mirror circuit containing a plurality of transistors; and
        a second current mirror circuit connected between a power supply terminal supplying a power supply voltage and the first current mirror circuit; and
    a start-up detection circuit configured to detect start-up of the constant current generation circuit, and transmit a detection signal;
    a clamp circuit configured to apply a start-up voltage to the constant current generation circuit, the start-up voltage being a voltage close to the gate voltages of the plurality of transistors in the first current mirror circuit in a state where the constant current generation circuit operates, the start-up voltage being higher than the gate voltages of the plurality of transistors; and
    a power supply start-up detection circuit configured to detect whether the power supply voltage is applied to the power supply terminal, start up the clamp circuit by detecting the power supply voltage applied to the power supply terminal, receive the detection signal from the start-up detection circuit, and stop the clamp circuit by receiving the detection signal;
    wherein the start-up detection circuit is configured by a constant current inverter,
    wherein the constant current inverter contains an output terminal, and
    wherein the power supply start-up detection circuit includes a logic circuit configured to receive the detection signal from the constant current inverter, a capacitor provided between the power supply terminal and the output terminal, and a current mirror circuit configured to allow a through-current to flow into the capacitor, the through-current being generated when the logic circuit inverts an output signal.

* * * * *